(12) United States Patent
Nezu et al.

(10) Patent No.: US 10,978,275 B2
(45) Date of Patent: Apr. 13, 2021

(54) MANUFACTURING METHOD OF SHOWERHEAD FOR PLASMA PROCESSING APPARATUS

(71) Applicant: Tokyo Electron Limited, Tokyo (JP)

(72) Inventors: Takaaki Nezu, Miyagi (JP); Yoshitaka Tamura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 70 days.

(21) Appl. No.: 16/421,722

(22) Filed: May 24, 2019

(65) Prior Publication Data
US 2019/0362947 A1    Nov. 28, 2019

(30) Foreign Application Priority Data

May 28, 2018 (JP) .............................. JP2018-101428

(51) Int. Cl.
*H01J 37/32* (2006.01)
*H01L 21/67* (2006.01)
*B05B 1/18* (2006.01)

(52) U.S. Cl.
CPC .......... *H01J 37/32449* (2013.01); *B05B 1/18* (2013.01); *H01J 37/32091* (2013.01); *H01L 21/67069* (2013.01); *H01J 2237/334* (2013.01)

(58) Field of Classification Search
CPC ........... H01J 37/32449; H01J 37/32091; H01J 2237/334; H01L 21/67069; C23C 16/455
USPC ............ 118/715; 156/345.1, 345.33, 345.34; 29/527.1
See application file for complete search history.

(56) References Cited

U.S. PATENT DOCUMENTS

2005/0255241 A1* 11/2005 Murakami ........ C23C 16/45574
427/248.1
2008/0305246 A1* 12/2008 Choi ................. C23C 16/45565
427/74

FOREIGN PATENT DOCUMENTS

JP            2014-120764         6/2014

* cited by examiner

*Primary Examiner* — Rudy Zervigon
(74) *Attorney, Agent, or Firm* — IPUSA, PLLC

(57) ABSTRACT

There is provision of a showerhead assembly including a plate provided with multiple gas holes. Each of the gas holes has a first opening, a second opening, and a gas passage disposed between the first opening and the second opening. The gas passage has a first portion communicating with the first opening and a second portion communicating with the second opening. The second portion has a funnel-like shape or a bell-like shape, and an edge of the second opening is rounded.

5 Claims, 8 Drawing Sheets

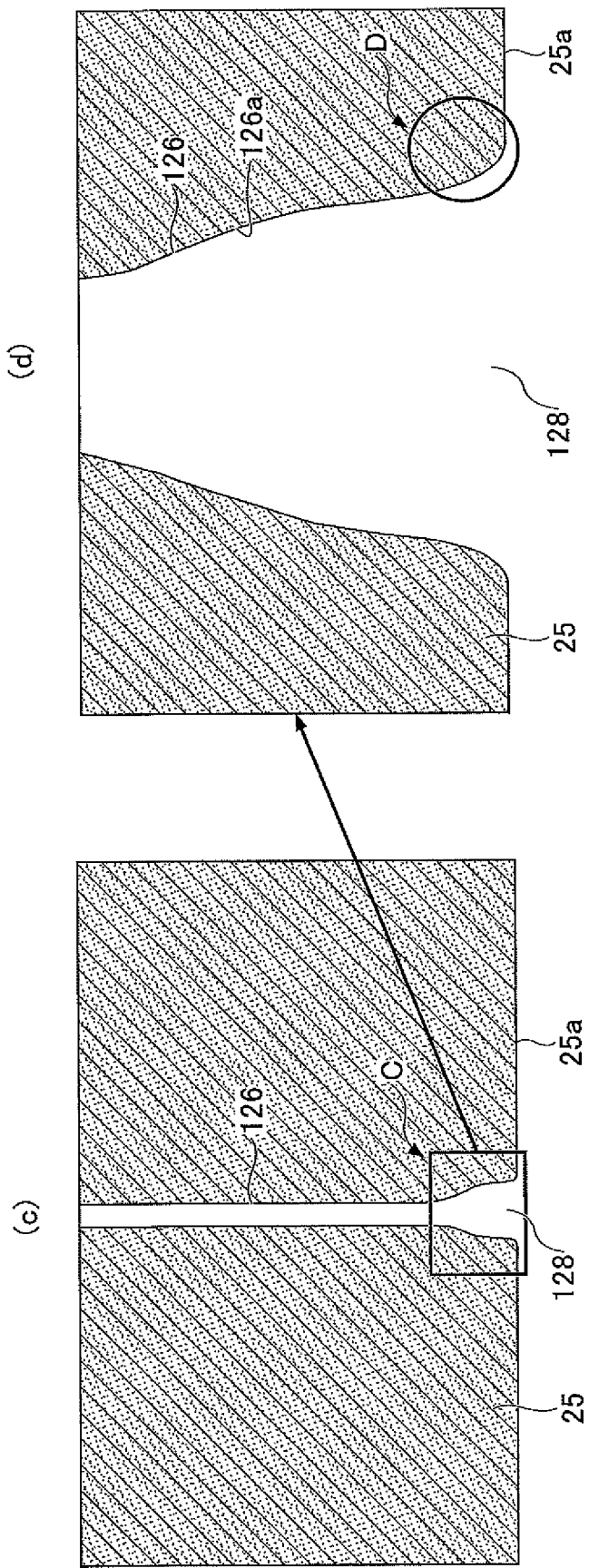

COMPARATIVE EXAMPLE 1

COMPARATIVE EXAMPLE 2

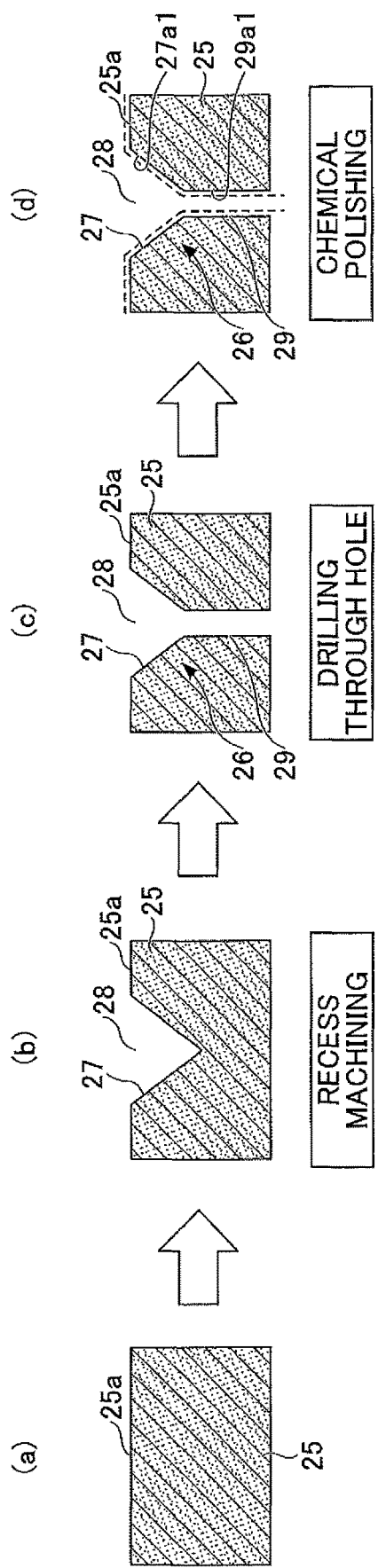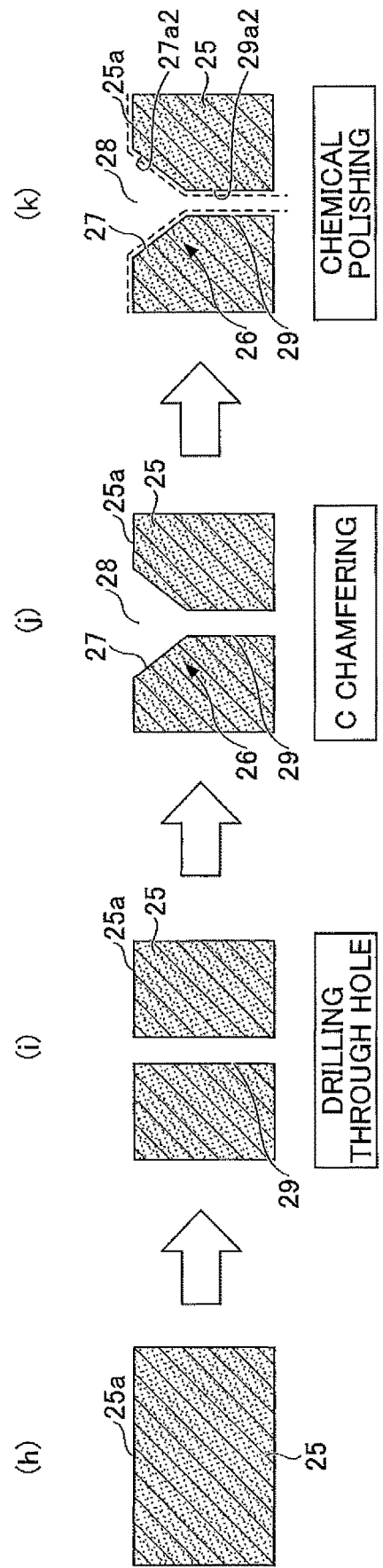

MANUFACTURING METHOD OF SHOWERHEAD FOR PLASMA PROCESSING APPARATUS

CROSS-REFERENCE TO RELATED APPLICATIONS

This patent application is based on and claims priority to Japanese Patent Application No. 2018-101428 filed on May 28, 2018, the entire contents of which are incorporated herein by reference.

TECHNICAL FIELD

The present disclosure relates to a showerhead assembly and a processing apparatus.

BACKGROUND

Patent Document 1 discloses an upper electrode plate having at least one gas hole, which is a through-hole penetrating the upper electrode plate vertically.

CITATION LIST

[Patent Document]
[Patent Document 1] Japanese Laid-open Patent Application Publication No. 2014-120764

SUMMARY

The present disclosure relates to providing a technique for reducing particles generated from an upper electrode assembly.

According to an aspect of the present disclosure, a showerhead assembly including a plate is provided. Multiple gas holes are formed on the plate. Each of the gas holes has a first opening, a second opening, and a gas passage disposed between the first opening and the second opening. The gas passage has a first portion communicating with the first opening and a second portion communicating with the second opening. The second portion has a funnel-like shape or a bell-like shape, and an edge of the second opening is rounded.

BRIEF DESCRIPTION OF THE DRAWINGS

FIG. 2B is a diagram illustrating a cross section of an example of an optimized gas hole;

FIGS. 5A and 5B are diagrams illustrating examples of a manufacturing process of the gas hole on an upper electrode assembly according to the embodiment.

DETAILED DESCRIPTION OF EMBODIMENTS

In the following, embodiments of the present disclosure will be described with reference to the drawings. Note that in the following descriptions and the drawings, elements having substantially identical features are given the same reference symbols and overlapping descriptions may be omitted.

[Overall Structure of Processing Apparatus]

Figure 1:
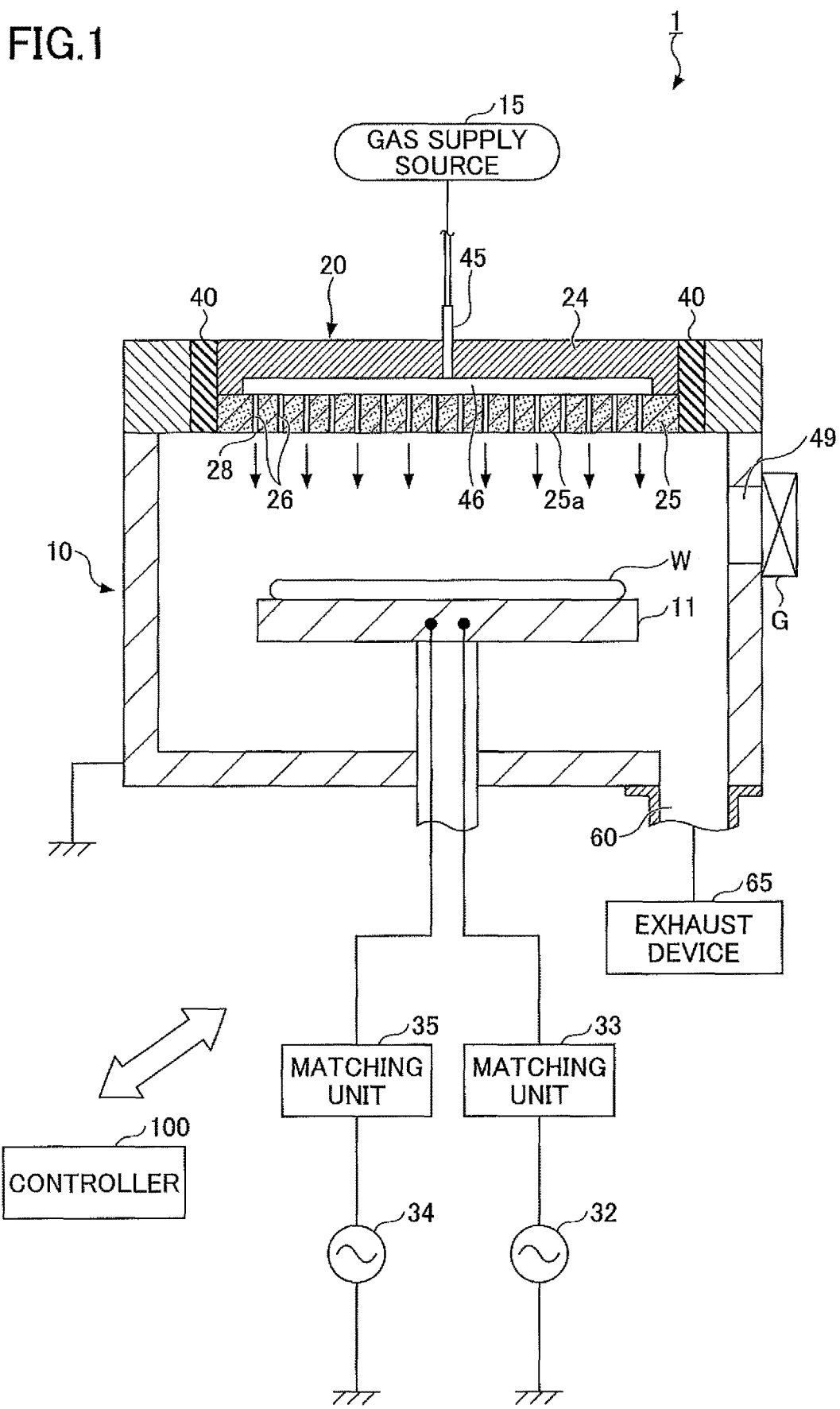
FIG. 1 is a cross-sectional view of an example of a processing apparatus according to an embodiment.

First, an overall structure of a processing apparatus 1 according to an embodiment will be described with reference to FIG. 1. FIG. 1 is a cross sectional view of an example of the processing apparatus 1. The present embodiment describes a case in which the processing apparatus 1 is a capacitively coupled type plasma etching apparatus.

Types of processes applicable to a wafer W by the processing apparatus 1 are not limited to a specific process, but an atomic layer etching (ALE), a reactive ion etching (RIE), and the like, can be applied to the wafer W, for example.

The processing apparatus 1 includes a processing vessel (chamber) 10, a gas supply source 15, and an exhaust device 65. The processing vessel 10 is made from conductive material such as aluminum, and is grounded. The gas supply source 15 supplies gas into the processing vessel 10.

An exhaust port 60 is formed at a bottom surface of the processing vessel 10. An exhaust device 65 is connected to the exhaust port 60, and the processing vessel 10 is evacuated by the exhaust device 65. Accordingly, the inside of the processing vessel 10 is maintained at a desirable quality of vacuum.

A lower electrode 11 and an upper electrode 20 facing the lower electrode 11 are provided in the processing vessel 10. The lower electrode 11 also functions as a stage on which a wafer W is placed. A high frequency power source 32 and a high frequency power source 34 are connected to the lower electrode 11. The high frequency power source 32 supplies high frequency electric power HF for generating plasma. The high frequency power source 34 supplies high frequency electric power LF for attracting ions, and a frequency of the high frequency electric power LF is lower than a frequency of the high frequency electric power HF. The high frequency power source 32 is connected to the lower electrode 11 via a matching unit 33. The high frequency power source 34 is connected to the lower electrode 11 via a matching unit 35. The matching units 33 and 35 are provided in order to cause internal impedance of the high frequency power source 32 and internal impedance of the high frequency power source 34 to match impedance of loads. That is, the matching unit 33 functions such that internal impedance of the high frequency power source 32 apparently coincides with the load impedance while a plasma is generated in the processing vessel 10. Similarly, the matching unit 35 functions such that internal impedance of the high frequency power source 34 apparently coincides with the load impedance while a plasma is generated in the processing vessel 10.

The upper electrode 20 is provided at a ceiling of the processing vessel 10 via an insulating shield ring 40 covering a periphery of the upper electrode 20. The upper electrode 20 includes an upper electrode assembly 25 and a support 24. The upper electrode assembly 25 is a substantially disc-shaped plate (top plate). The upper electrode assembly 25 has conductivity, and is made from silicon, for example. However, the upper electrode assembly 25 is not limited to silicon, and the upper electrode assembly 25 may contain either quartz or silicon carbide. On a surface 25a of the upper electrode assembly 25 facing the lower electrode 11, a plasma-proof ceramic coating may be formed. Multiple gas holes 26 are formed on the upper electrode assembly 25 at regular intervals. Each of the gas holes 26 extends in an approximately vertical direction, and penetrates the upper electrode assembly 25.

The support 24 detachably supports the upper electrode assembly 25. The support 24 is made from aluminum, for example. In the support 24, a gas diffusion chamber 46 is formed. The multiple gas holes 26 extend from the gas diffusion chamber 46. The gas diffusion chamber 46 is connected to the gas supply source 15 via a gas pipe 45.

Gas is supplied from the gas supply source 15 to the diffusion chamber 46 through the gas pipe 45. The gas supplied to the diffusion chamber 46 passes through the multiple gas holes 26, and is introduced to the processing vessel 10 through the multiple gas holes 26. Accordingly, the upper electrode 20 functions as a gas showerhead for supplying gas.

A gate valve G is provided at a side wall of the processing vessel 10. The gate valve G is used for opening and/or closing a loading/unloading port 49 when a wafer W is loaded into the processing vessel 10 or unloaded from the processing vessel 10.

The processing apparatus 1 is equipped with a controller 100 that controls an entirety of the processing apparatus 1. The controller 100 includes a CPU (Central Processing Unit), a ROM (Read Only Memory), and a RAM (Random Access Memory). The RAM stores a process recipe. In the process recipe, control information of the processing apparatus 1 in accordance with a process condition is recorded. The control information includes a process time, pressure, magnitude of high frequency electric power, a gas type, a flow rate of the gas, and a temperature in a chamber (such as a wafer temperature). The controller 100 controls a predetermined process in accordance with the process recipe stored in the RAM.

When a plasma processing is performed in the above-described processing apparatus 1, the gate valve G is opened, a wafer W held by a loading arm is loaded into the processing vessel 10, and the wafer W is placed on the stage (lower electrode 11) by operating a lifter pin.

The gas supply source 15 supplies a gas necessary for the processing, and the high frequency power source 32 applies, to the lower electrode 11, the high frequency electric power HF for generating plasma. The high frequency power source 34 applies, to the lower electrode 11, the high frequency electric power LF for attracting ions. When a plasma is generated by the high frequency electric power, a plasma processing is applied to the wafer W by the plasma. After the plasma processing to the wafer W is completed, the wafer W is passed to the loading arm by the lifter pin, and the wafer W is carried out of the processing vessel 10 after the gate valve G is opened.

[Particles]

The upper electrode assembly 25 is abraded mainly by ions in the plasma generated during a plasma processing. Thus, an upper electrode assembly 25 abraded by a predetermined amount needs to be replaced with a new upper electrode assembly 25. In a case in which a new upper electrode assembly 25 is installed in the processing apparatus 1 at the time of maintenance, particles are generated from the upper electrode assembly 25 for a certain period of time after the upper electrode assembly 25 is installed, when the processing apparatus 1 is used. Similarly, in a case in which a brand-new processing apparatus 1 is used, particles are generated from a new upper electrode assembly 25 for a certain period of time.

That is, in a case in which a new upper electrode assembly 25 is installed in the processing apparatus 1, the amount of particles generated from the upper electrode assembly 25 will not decrease until the processing apparatus 1 has been used for a certain period of time. For example, if the processing apparatus 1 equipped with a new upper electrode assembly 25 is used for 250 hours, the amount of particles generated from the upper electrode assembly 25 becomes approximately one third of the amount of particles generated from a new upper electrode assembly 25 that has just been installed in the processing apparatus 1. That is, approximately 70% of all particles generated from a new upper electrode assembly 25 are generated during 250 hours of usage time after the new upper electrode assembly 25 has been installed in the processing apparatus 1. In the following, a range of usage hours of the processing apparatus 1 beginning from installation of a new upper electrode assembly 25 and not exceeding a predetermined threshold, such as 250 hours, is referred to as an "initial stage". Because particles cause a defect of a wafer W, such as disconnection of a wiring pattern formed on the wafer W, productivity decreases.

One conceivable method of reducing particles and defects is selectively performing a plasma processing corresponding to a process condition in which particles are not generated from the upper electrode assembly 25 in the processing apparatus 1, when the processing apparatus 1 is in the initial stage.

However, such a method reduces flexibility of an operation of the processing apparatus 1, and is not efficient. Further, the above-described operation is not applicable to some plasma processes. The present embodiment aims at providing the processing apparatus 1 capable of reducing generation of particles from the upper electrode assembly 25.

It has been thought that particles are generated from the upper electrode assembly 25 because of a fractured layer on an inner surface of the gas hole that is formed when the gas hole is made. Thus, chemical polishing (CP) has been performed conventionally to remove the fractured layer on the inner surface of the gas hole. However, generation of particles has not been able to be reduced by chemical polishing.

Through trial and error, inventors of this application have succeeded in reducing particles generated from the upper electrode assembly 25, by optimizing a shape of the gas hole of the upper electrode assembly 25.

Figure 2A:
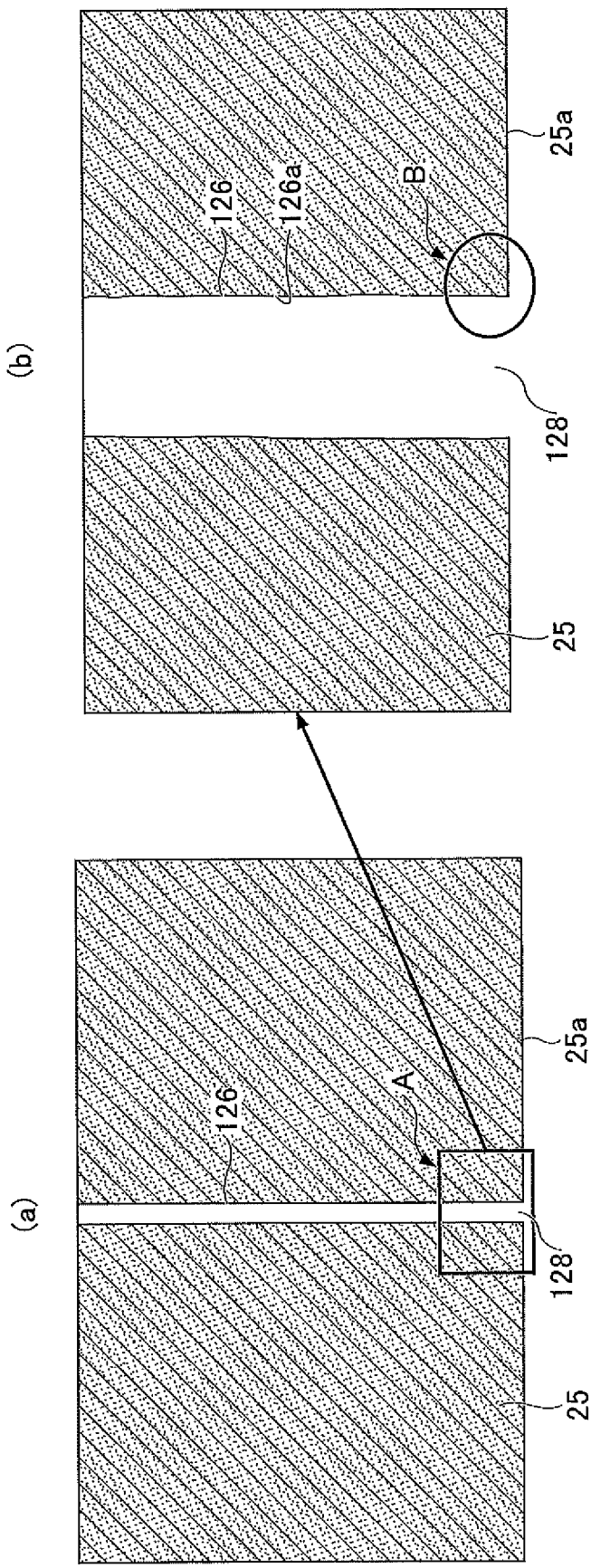
FIG. 2A is a diagram illustrating an example of a gas hole formed on a conventional upper electrode.

FIG. 2A illustrates an example of a cross section of a conventional gas hole 126 formed in an upper electrode. The upper electrode illustrated in FIG. 2A is new, and is in a state just after the upper electrode has been installed. As illustrated in a diagram (a) of FIG. 2A, the conventional gas hole 126 penetrates the upper electrode vertically. A diagram (b) of FIG. 2A is an enlarged view of a region A of the diagram (a). On an inner surface 126a of the gas hole 126 illustrated in the diagram (b), a fractured layer remains despite chemical polishing having been applied. Also, the inner surface 126a is somewhat rough. Further, as can be seen from a region B of the diagram (b), an edge of an opening 128 of the gas hole 126 is sharp.

A gas hole 126 optimized by the inventors as a result of their trial and error will be illustrated in FIG. 2B. A diagram (c) of FIG. 2B illustrates a cross section of the gas hole 126 optimized by the inventors, and a diagram (d) of FIG. 2B is an enlarged view of a region C of the diagram (c). As can be seen from FIG. 2B, a diameter of the gas hole 126 increases toward an opening 128. Also, with respect to an inner surface 126a of the gas hole 126 illustrated in FIG. 2B, a fractured layer is eliminated, and the inner surface 126a is smooth, as illustrated in the diagram (d) of FIG. 2B. Further, as can be seen from a region D of the diagram (d), an edge of an opening 128 of the gas hole 126 is rounded. As described above, it is found that the diameter of the gas hole 126 increases toward the opening 128, that the inner surface of the gas hole 126 is smooth, that a fractured layer is not present on the inner surface of the gas hole 126, and that the edge of the opening 128 of the gas hole 126 is rounded.

Figure 3A:
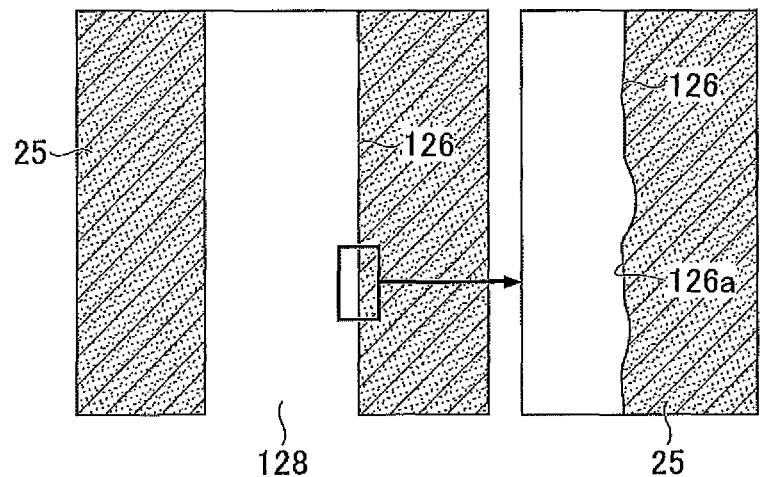
FIGS. 3A and 3B are diagrams illustrating gas holes according to comparative examples.
Figure 3B:
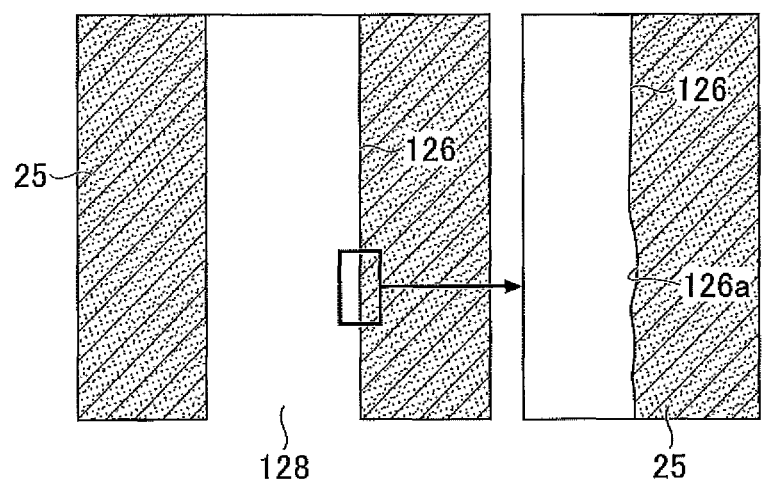

FIGS. 3A and 3B illustrate a gas hole according to Comparative Example 1 and a gas hole according to Comparative Example 2, respectively. A gas hole 126 according to Comparative Example 1 in FIG. 3A is made by forming a through-hole vertically penetrating an upper electrode, and chemical polishing is not applied after forming the through-hole. A gas hole 126 according to Comparative Example 2 in FIG. 3B is made by forming a through-hole vertically penetrating an upper electrode, and chemical polishing is applied to the gas hole 126 after forming the through-hole. Although an inner surface 126a of the gas hole 126 according to Comparative Example 2 is smoother than that according to Comparative Example 1, the inner surface 126a according to Comparative Example 2 remains slightly rough.

Figure 3C:
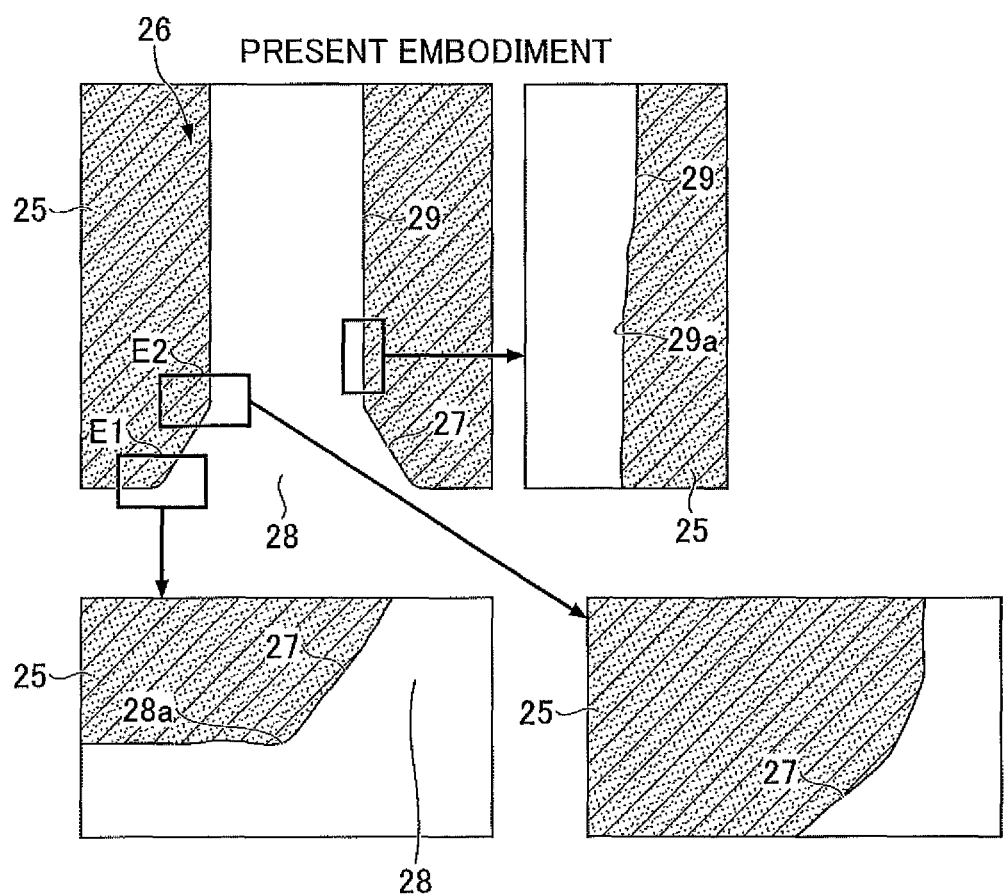
FIG. 3C illustrates diagrams illustrating a gas hole according to the embodiment.

FIG. 3C illustrates a gas hole according to the present embodiment. A top left diagram of FIG. 3C is a cross sectional view of the gas hole 26 according to the present embodiment, and two diagrams at the bottom of FIG. 3C are each enlarged views of regions E1 and E2 in the top left diagram of FIG. 3C. The gas hole 26 according to the present embodiment includes an opening (may also be referred to as a "first opening) provided at an upper surface of the upper electrode assembly 25, another opening (may also be referred to as a "second opening") provided at the surface 25a of the upper electrode assembly 25 facing the lower electrode 11, and a gas passage provided between the first opening and the second opening. Note that, in the present embodiment, a set of the second opening and a portion (first portion) of the gas passage communicating with the second opening may be referred to as an "opening region 28", and the rest (second portion) of the gas passage (communicating with the first opening) may be referred to as a "through-hole 29". With respect to the gas hole 26 according to the present embodiment, a side surface 27 of the opening region 28 of the gas hole 26 is formed into a funnel-like shape. Also, as illustrated in the enlarged views of the regions E1 and E2, an edge (a farther edge with respect to the through-hole 29) 28a of the opening region 28 (or the second opening) and a joint portion between the side surface 27 and the through-hole 29 are rounded. Further, chemical polishing is applied to the side surface 27 to an extent that the side surface 27 is abraded by approximately 40 µm from the original state. As a result, an inner surface 29a of the through-hole 29 of the gas hole 26 and the side surface 27 are smoother than the gas hole 126 according to Comparative Example 2.

By performing the above-described processing, the multiple gas holes 26 formed on the plate member of the upper electrode assembly 25 can be shaped such that the opening region 28 is funnel-shaped, that the side surface of the opening region 28 is smooth, and that the edge 28a of the opening region 28 is rounded.

As a result, generation of particles from the upper electrode assembly 25 can be reduced. Also, it is preferable that chemical polishing is applied to each of the gas holes 26 of the upper electrode assembly 25 according to the present embodiment, and that the chemical polishing is performed until a fractured layer is eliminated. For example, a length of time for performing the chemical polishing may be a time until the inner surface of the gas hole 26 is abraded by approximately 40 µm. By performing the chemical polishing until the inner surface of the gas hole 26 is abraded by approximately 40 µm, generation of particles from the upper electrode assembly 25 can be further reduced.

[Shape of Gas Hole]

Figure 4A:
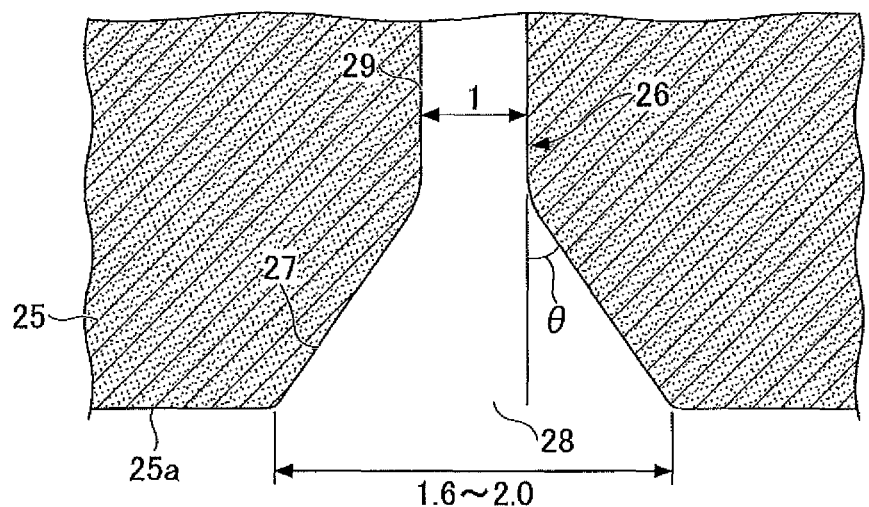
FIGS. 4A and 4B are diagrams illustrating shapes of gas holes according to the embodiment.
Figure 4B:
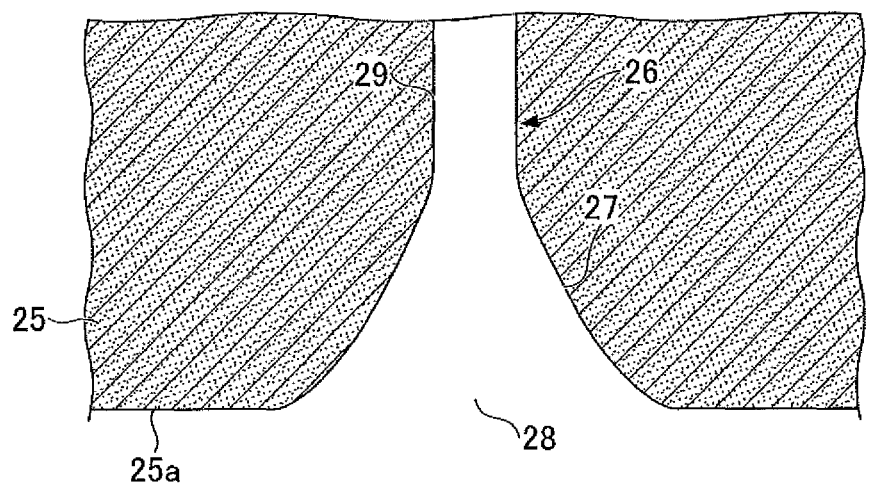

As one example of the gas hole 26 according to the present embodiment, a funnel-shaped gas hole 26 is illustrated in FIG. 4A. Also, as another example of the gas hole 26 according to the present embodiment, a bell-shaped gas hole 26 is illustrated in FIG. 4B. In FIG. 4A, an opening region 28 of the gas hole 26 is formed into a shape of a conical funnel, a diameter of which increases toward a farther edge of the opening region 28, and the farther edge of the opening region 28 is rounded. Also, the gas hole 26 is chemically polished to the extent that a fractured layer is abraded, and the surface of the gas hole 26 is formed smoothly. Further, a closer edge of the opening region 28 of the gas hole 26 is connected to a through-hole 29 that penetrates the upper electrode assembly 25 vertically. The opening region 28 of the gas hole 26 and the through-hole 29 are formed such that both of them have a common axis.

As illustrated in FIG. 4A, a diameter of the opening region 28 of the gas hole 26 is the widest at the farther edge of the opening region 28. The diameter of the farther edge may be formed within a range from 1.6 to 2.0 times as large as a diameter of the through-hole 29 (or the first opening).

Further, a side surface 27 of the opening region 28 may be formed such that an angle θ formed by the side surface 27 and an extended line of (a side surface of) the through-hole 29 is between 30° and 60°, and may preferably be formed such that the angle θ is 45°.

In addition, as illustrated in FIG. 4B, the opening region 28 of the gas hole 26 may be of a bell-like shape, like a bell of a horn or trumpet (hereinafter, a shape of the opening region 28 as illustrated in FIG. 4B is referred to as a "bell-shape"). In a case in which the opening region 28 is of a funnel-like shape, a slant of the side surface 27 is substantially constant. On the other hand, with respect to the bell-shaped opening region 28, a slant of a side surface 27 that increases toward a farther edge is not constant, and the slant becomes smaller toward the farther edge. The farther edge of the opening region 28 is rounded.

In the bell-shaped opening region 28, similar to the funnel-shaped opening region 28, a diameter of the bell-shaped opening region 28 is the widest at the farther edge, and the diameter of the farther edge may be formed within a range from 1.6 to 2.0 times as large as a diameter of the through-hole 29 (or the first opening).

[Manufacturing Method of Gas Hole]

Next, examples of a manufacturing method of the gas hole according to the present embodiment will be described with reference to FIGS. 5A and 5B. FIG. 5A is a first example of the manufacturing method of the gas hole according to the present embodiment. FIG. 5B is a second example of the manufacturing method of the gas hole according to the present embodiment.

In the first example illustrated in FIG. 5A, to the surface 25a (that faces a plasma generating space) of the plate of the upper electrode assembly 25 illustrated in a diagram (a) of FIG. 5A, a step of forming an opening region 28 is performed, by creating a recess composed of a sloping surface, as illustrated in a diagram (b) of FIG. 5A. By this step, a slope (side surface 27) having an angle of 30° to 60° is formed. That is, the opening region 28 for a gas hole 26 is formed into a funnel shape. Subsequently, a step of forming a through-hole 29 communicating with the opening region 28 is performed. By this step, the gas hole 26 having the opening region 28 and the through-hole 29 is formed, as illustrated in a diagram (c) of FIG. 5A.

Next, a step of chemically polishing to the gas hole 26 having the opening region 28 and the through-hole 29 is performed (diagram (d) of FIG. 5A). By applying chemical polishing, an edge of the opening region 28 becomes rounded. The amount of time for applying the chemical polishing may preferably be determined so that an inner surface 29a1 of the gas hole 26 (through-hole 29) is abraded by approximately 40 µm.

In the upper electrode assembly 25 having the gas hole 26 manufactured by the above-described method, the opening region 28 is formed into a funnel shape, the inner surface of the gas hole 26 is smooth, and the edge (farther edge) of the opening region 28 is not sharp, and is formed into a rounded shape. The gas hole 26 configured as described above, in which the opening region 28 communicates with the through-hole 29, can suppress generation of particles from the upper electrode assembly 25, and can reduce defects.

In the second example illustrated in FIG. 5B, to the surface 25a of the plate of the upper electrode assembly 25 illustrated in a diagram (h) of FIG. 5B, a step of forming a through-hole 29 penetrating the plate is applied, as illustrated in a diagram (i) of FIG. 5B.

Subsequently, a step of forming an opening region 28 communicating with the through-hole 29 is performed. At this step, C chamfering is performed such that a slant of a side surface 27 of the opening region 28 is within a range between 30° and 60°. By this step, the opening region 28 of a funnel shape communicating with the through-hole 29 is formed on the surface 25a of the plate. That is, as illustrated in a diagram (j) of FIG. 5B, the gas hole 26 having the opening region 28 and the through-hole 29 is manufactured.

Next, a step of chemically polishing to the gas hole 26 having the opening region 28 and the through-hole 29 is performed (diagram (k) of FIG. 5B). The amount of time for applying the chemical polishing may preferably be determined so that an inner surface 29a2 of the gas hole 26 is abraded by approximately 40 µm.

Instead of forming a funnel-shaped opening region 28 on a plate as illustrated in the diagram (c) of FIG. 5A or the diagram (j) of FIG. 5B, a bell-shaped opening region 28 may be formed on the plate.

The method of manufacturing the upper electrode assembly 25 has been described above, which includes a step of forming an opening region 28 having a funnel shape or a bell shape on a plate member, a step of forming a through-hole 29 communicating with the opening region 28, and a step of shaping an edge of the opening region 28 into a rounded shape. Also, as an example of the step of shaping the edge of the opening region 28 into the rounded shape, chemically polishing to the gas hole 26 has been described.

[Effect of Manufacturing Method of Gas Hole]

Figure 6B:
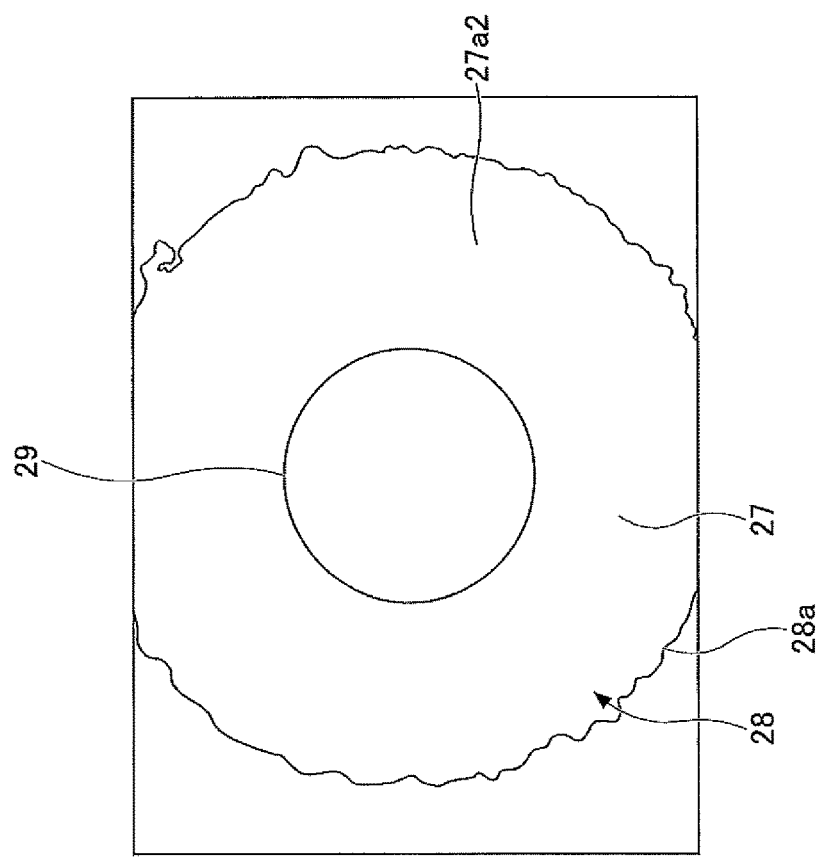
FIGS. 6A and 6B are diagrams illustrating an effect of the manufacturing process of the gas hole on the upper electrode assembly according to the embodiment.
Figure 6A:
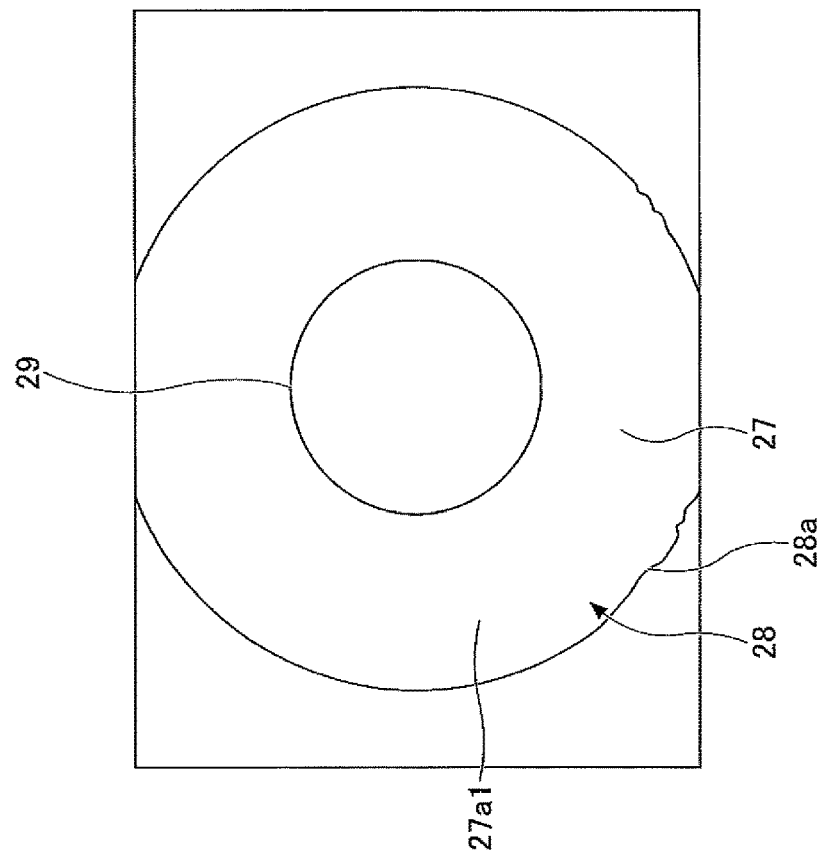

The effect of the manufacturing method of the gas hole according to the present embodiment will be described with reference to FIGS. 6A and 6B. FIG. 6A illustrates a side surface 27a1 of an opening region 28 of a gas hole 26 manufactured by the first example of the manufacturing method, which is described with reference to FIG. 5A. FIG. 6B illustrates a side surface 27a2 of an opening region 28 of a gas hole 26 manufactured by the second example of the method, which is described with reference to FIG. 5B.

As can be seen from FIGS. 6A and 6B, it was found that the side surface 27a1 and a farther edge 28a of the opening region 28 illustrated in FIG. 6A, which were made by forming a through-hole 29 after forming the opening region 28, were formed more smoothly than the side surface 27a2 and a farther edge 28a of the opening region 28 illustrated in FIG. 6B, which were made by forming the opening region 28 after forming a through-hole 29.

This is considered because of the following reason. If the funnel-shaped opening region 28 is formed after forming the through-hole 29, an internal space of the through-hole 29 causes vibration when forming the funnel-shaped opening region 28. Thus, roughness occurs on the side surface 27a2 of the opening region 28.

In contrast, in a case in which the through-hole 29 is formed communicating with the funnel-shaped opening region 28 after forming the opening region 28 on the surface 25a of the plate member, because the internal space of the through-hole 29 is not present when forming the opening region 28, a process of carving a conical recess is performed to a solid silicon plate. As a result, the side surface 27a1 of the opening region 28 of the gas hole 26 becomes smoother than the side surface 27a2. Accordingly, the gas hole 26 having the side surface 27a1 illustrated in FIG. 6A can further reduce generation of particles from the upper electrode assembly 25.

From the above results, it is preferable to manufacture the upper electrode assembly 25 by a manufacturing method including a step of forming a funnel-shaped or bell-shaped opening region 28 on a plate member, a step of forming a through-hole 29 communicating with the opening region 28, and a step of shaping an edge of the opening region 28 into a rounded shape.

In addition, it is preferable to manufacture the upper electrode assembly 25 in accordance with the first example of the manufacturing method according to the present embodiment illustrated in FIG. 5A. That is, the step of forming the through-hole 29 communicating with the opening region 28 is preferably performed after the step of forming the funnel-shaped or bell-shaped opening region 28 on the plate member.

The processing apparatus 1, in which the upper electrode assembly 25 having a gas hole 26 manufactured by the above-described manufacturing method is installed, can reduce generation of particles. As a result, any processes can be performed, including processes performed under process conditions in which particles tend to be generated.

As described above, the upper electrode assembly 25 according to the present embodiment can reduce generation of particles from the upper electrode assembly 25.

The upper electrode assembly, the processing apparatus, and the manufacturing method of the upper electrode assembly according to the above-described embodiment should be considered exemplary and not to be restrictive. The above-described embodiment can be modified and enhanced in various forms without departing from the claims and the gist thereof. Matters described in the above embodiment may be changed to other configurations, and may be combined unless inconsistency occurs.

The processing apparatus according to the present disclosure can be applicable to any type of processing apparatus, such as a capacitively coupled plasma (CCP) type, an inductively coupled plasma (ICP) type, a radial line slot antenna (RLSA) type, an electron cyclotron resonance plasma (ECR) type, and a helicon wave plasma (HWP) type.

In the present specification, a wafer W has been described as an example of a substrate. However, the substrate is not limited to a wafer W. Examples of the substrate may include various types of substrates used in an LCD (Liquid Crystal Display) or a FPD (Flat Panel Display), a CD substrate, or a printed circuit board.

What is claimed is:

1. A method of manufacturing a showerhead for use in a plasma processing apparatus, the method comprising:
    a) providing a plate;
    b) forming a plurality of through-holes into the plate, each through-hole having a first portion and a second portion, the second portion having a funnel-like shape or a bell-like shape; and
    c) chemically polishing an inner surface of the through-hole until the inner surface is abraded by approximately 40 µm.

2. The method according to claim 1, wherein the plate is formed of a material selected from a group consisting of silicon, quartz, silicon carbide, and combination thereof.

3. The method according to claim 1, wherein a side surface of the second portion of the through-hole is angled at 45° with respect to a direction along the through-hole.

4. The method according to claim 1, wherein
    a side surface of the second portion of the through-hole is angled at a range between 30° and 60° with respect to a direction along the through-hole.

5. The method according to claim 4, wherein the plate is formed of a material selected from a group consisting of silicon, quartz, silicon carbide, and combination thereof.

* * * * *